United States Patent [19]
Gudesen et al.

[11] Patent Number: 6,115,344
[45] Date of Patent: Sep. 5, 2000

[54] DEVICE AND METHOD FOR OPTICAL DATA STORAGE HAVING MULTIPLE OPTICAL STATES

[75] Inventors: Hans Gude Gudesen, Gamle Fredrikstad; Per-Erik Nordal, Nesbru, both of Norway

[73] Assignee: Opticom ASA, Oslo, Norway

[21] Appl. No.: 08/952,421

[22] PCT Filed: May 22, 1996

[86] PCT No.: PCT/NO96/00125

§ 371 Date: Nov. 20, 1997

§ 102(e) Date: Nov. 20, 1997

[87] PCT Pub. No.: WO96/37888

PCT Pub. Date: Nov. 28, 1996

[30] Foreign Application Priority Data

May 23, 1995 [NO] Norway ..................................... 952040

[51] Int. Cl.[7] ...................................................... G11B 7/00
[52] U.S. Cl. ............................ 369/100; 369/284; 430/19
[58] Field of Search ..................................... 369/100, 288, 369/284, 108, 275.2; 430/19, 139, 945, 495; 365/106, 111

[56] References Cited

U.S. PATENT DOCUMENTS

| | | |
|---|---|---|
| 4,701,880 | 10/1987 | Ichihara . |
| 5,088,086 | 2/1992 | Van et al. . |
| 5,268,862 | 12/1993 | Rentzepis . |
| 5,399,451 | 3/1995 | Hashida et al. ........................... 430/19 |

FOREIGN PATENT DOCUMENTS

| | | |
|---|---|---|
| 159397 | 10/1985 | European Pat. Off. . |
| 193931 | 9/1986 | European Pat. Off. . |
| 0284056 | 9/1988 | European Pat. Off. . |
| 415763 | 3/1991 | European Pat. Off. . |
| 415763A2 | 6/1991 | European Pat. Off. . |
| 503428 | 9/1992 | European Pat. Off. . |
| 568753 | 11/1993 | European Pat. Off. . |
| 593037 | 4/1994 | European Pat. Off. . |
| 63-133332 | 6/1988 | Japan . |
| WO9001480 | 2/1990 | WIPO . |

OTHER PUBLICATIONS

"Polymethine dye photodestruction processes in the active layers of optical disks" E.S. Voropai, et al., 1992 The Optical Society of America (Mar. 1992) pp. 305–308.

"Spectral hole–burning studies of organic chromophores in geometrically restricted amorphous phases" H.W. Kindervater, et al. Journal of Luminescence 64 (May 1995) pp. 231–237.

Primary Examiner—Ali Neyzari

[57] ABSTRACT

The optical storage device and method includes a fluorescent layer arranged on a substrate and having a surface. The fluorescent layer is composed of fluorescent dye molecules embedded in a transparent polymeric base material. A group of data-carrying structures are arranged in the fluorescent layer. Each of the data-carrying structures has more than two optical states represented by a specific degree of quenching of fluorescence emitted from the data-carrying structure when irradiated with a fluorescence exciting radiation.

38 Claims, 3 Drawing Sheets

DEVICE AND METHOD FOR OPTICAL DATA STORAGE HAVING MULTIPLE OPTICAL STATES

FIELD OF THE INVENTION

The invention concerns a data carrying method or medium, including a fluorescent layer arranged on a substrate, wherein data carrying structures are provided in the fluorescent layer in its surface or from its surface and towards the substrate.

BACKGROUND OF INVENTION

Digital optical data storage media of the WORM type (Write Once, Read Many times) stores information written on a thin layer by means of a light pulse of high intensity, typically a strongly focused laser beam. Once data is written on to the layer, the layer cannot be returned to its original state, but it can be read many times by a weaker light beam which does not further influence the layer's physical state. Well known means in this context are thin metal film, flat glass or plastic surfaces or thin polymer film which contains a light-absorbing dye. In most cases such layers are provided between other layers, e.g. reflecting or protective layers. The layer stores information by undergoing a change under the influence of the powerful write light pulse and constitutes the actual data storage layer in the medium.

For the most part today's optical storage technology is almost exclusively based on the reflective contrast between written marks in the data storage layer or its immediate surroundings. A focused laser beam is passed along the data storage layer and changes in the intensity of the reflected laser light are recorded when the beam passes a write mark. A typical mark may be in the form of small round or elongated pits, with dimensions of between 0.5 and 7 μm. Optical data storage media which are based on reflection normally employ a strongly reflecting layer, e.g. a vaporized aluminium layer in a multilayer structure where the data storage layer regulates the amount of light incident on the medium which is reflected.

Data storage media are also known which are based on transmission contrast for light which is detected after having passed through the data storage medium. In this case, the data storage layer can have a low light transmission capacity in an unknown condition and be more transparent at the write marks which are formed by the powerful write beam. Alternatively the data storage layer can be converted from transparent to opaque at the write marks.

It is also known that data storage media are under development in which the contrast is based on stimulated light emission. During the reading of data one or more light beams scan the data storage medium which reacts by emitting light of an intensity which is dependent on how the medium was treated early in the write phase. The light energy emitted results from either the release of captured electrons in a high energy state in the data storage layer or down conversion of the scanning light beam. Holographic data storage media have also been proposed, with storage of data both on volume and layers. An important contrast mechanism in this connection is light-induced alteration of the refraction index.

Data storage media may also be based on the fluorescent properties, of a data storage layer. For instance, EP-A1-503428 discloses an erasable optical recording medium comprising at least one recording layer which includes a fluorescent material and a photo-reactive bistable quencher capable of quenching the fluorescence emitted from the fluorescent material. The photo-reactive bistable quencher produces two isomers, one having an absorption wavelength spectrum which is different from the other and the one being convertible into the other by an irradiation with light. One of these bistable isomers acts as a quencher for quenching the fluorescence emitted by the fluorescent material. Particularly the photo-reactive bistable quencher is a photo-chromic compound having a quenching action. Information is digitally recorded by utilising the two bistable isomers of the photo-reactive bistable quencher. In the erased state the absorption spectrum of the photo-bistable quencher is that of the long wavelength isomer, while in the recorded state the absorption spectrum is that of its short wavelength isomer. The information is recorded by causing the fluorescent material to absorb the irradiated light to transfer the absorbed energy to the photo-reactive bistable quencher, causing the photo-reactive quencher to participate in an isomerization reaction from the long wavelength isomer to the short wavelength isomer. The reading of the recorded information is performed either by detecting the fluorescence emitted from the fluorescent material or by transforming only a small portion of the photo-reactive bistable quencher which is included in the recorded layer in an excessive amount from its short wavelength isomer back to its long wavelength isomer state, thus activating the quencher. It will be seen that according to EP-A1-503482 the quenching action takes place by a photo induced chemical reaction and entails no depletion of the fluorescent material in a recorded spot on the recorded medium.

Most of today's commercially available, optical data storage media, however, are based on data storage layers of the WORM type, based on one of the following categories:

1) Hole formation in an absorbing or reflecting thin film, where the hole is produced by ablation or melting of a metal film. Such data storage layers can often be used without an underlying reflector and provide contrast when light which passes through the hole after the hole formation is lost in the internal data storage layer or behind it, thus enabling a dark mark to be recorded on a strongly reflecting background which it is read under reflection. Data storage media of this kind are also well suited to be read by means of transmission, provided that relatively little light is able to pass through the data storage layer before it is written on it.

2) Topographical mark formation by mass transport is known, e.g. in the form of a heat-induced pitting in a polymer film. During writing, a strong pulse is absorbed by focused light in the polymer film, causing local heating and transport of the polymer material away from the heated area. The physical process which is involved in the mass transport is normally thermoplastic deformation, possibly also evaporation or ablation in some cases. The result is that a pit is formed whose dimensions and shape are defined by the focal size of the light beam and the absorption efficiency of the polymer film, the duration of the exposure and the thermal diffusion and material transport parameters for the material in the write area in the data storage layer. Data are read from the medium by recording the total reflection coefficient for incident light which passes through the polymer layer and which is reflected from an underlying reflection layer and returns via the polymer film. In order to obtain the desired light-absorbing properties, the polymer film is usually treated with a dye.

3) Other data storage media of a similar nature are also known, where the data storage layer's absorbing or reflecting properties are modified by embedding particles suitable for this purpose in a transparent base material or where the surface of the data storage layer is influenced locally by a thermal process induced by a high-powered, focused laser beam, thus causing the surface in the illuminated point to become smoother and more reflective.

SUMMARY OF THE INVENTION

In the development of optical data storage media there is a general tendency towards progressively higher data densities.

Consequently it is an object of the present invention to obtain an optical data storage medium in which the data storage layer permits greater storage density by making the write marks substantially smaller. The requirement is to be able to generate write marks or data carrying structures which are smaller than 0.4 µm and which can easily be read. The data storage layer must not have particles or topographical structures which are larger than 0.1 µm. It is also the intention that the data storage layer's sensitivity should be sufficiently high to enable it to use light with a short pulse duration in order to achieve high spatial resolution and moreover to permit the use of short write pulse durations, thus obtaining correspondingly short thermal diffusion lengths.

It is another object of the present invention to provide a data storage layer with denser patterns of data carrying structures or write marks, thereby obtaining an increased data density. This means that data carrying structures based on material transport cannot be employed, unless the transported material is deposited in such a manner that it does not enter areas which are occupied by the adjacent, data carrying structures.

It is a further object of the present invention to provide a data storage medium which permits storage of several bits at the same site, i.e. several bits in each write mark or each data carrying structure. The normal situation is that a write mark or a data carrying structure in a conventional storage medium has a write mark which during reading will be in one of two possible states, corresponding to a binary 0 or a binary 1. The data storage layer's reflectance or transmittance is normally measured and a simple decision threshold decides whether the layer is exposed to a writing laser pulse or not at the location for the data carrying structure. Thus a specific object of the invention in the present case is to provide data carrying structures which can store more than 1 bit and above all provide a data carrying structure which permits coding of a grey scale. Consequently the data storage density in relation to present day known optical data storage media. In this connection, experiments have been conducted with electron capture in a multilevel storage layer developed by Optex Inc., who claim that it is possible to employ 16 grey scale levels, corresponding to 4 bits. This medium is read by generating fluorescence from electrons captured during writing and the possibility arises of storing a multilevel code by monitoring the strength of the fluorescence.

Finally the object of the present invention is to provide a data storage medium where the position of the focal point in the data storage layer is altered by changing the angle of incidence for light which is used for writing in the data storage layer, thus making it possible to form a dense pattern of data storage structures which are angle of incidence addressable, e.g. by means of microlenses provided on the data storage medium's surface, as disclosed in Norway patent application no. 900443.

The above-mentioned and other objects are achieved according to the invention. In accordance with one aspect of the optical storage medium of the invention, each of the data carrying structures has, according to the value of the datum it represents, a specific degree of quenching of the fluorescence which is emitted from this data carrying structure when it is irradiated with a fluorescence exciting radiation. The degree of quenching for the fluorescence refers to the fluorescence emitted by the virgin fluorescent layer in a region whose surface area is equal to the area of the data carrying structure at the surface of the fluorescent layer. The above and other objects may also be met with a data carrying the datum which the data carrying structure represents corresponds to a specific level in a predetermined, multilevel code, where each level corresponds to a specific degree of quenching of the fluoroescense. In accordance with another aspect of the invention, a method including directing a laser beam towards a point on the fluorescent layer, irradiating this point in such a manner that a data carrying structure is formed at this point in the fluorescent layer. Further, the data structure is produced by a thermal influence on the fluorescent layer and/or a photo induced influence on the fluorescent dye molecules provided in the fluorescent layer and possibly other molecules, whereby the data carrying structure obtains a specific degree of quenching for the fluorescence which is emitted from this data carrying structure when it is irradiated with fluorescence exciting radiation. In accordance with another aspect of the invention, a method includes directing a laser beam towards a point on the fluorescent layer, modulating the laser beam according to a predetermined modulation procedure which comprises a number of modulation stages corresponding to levels in a predetermined multilevel code, and irradiating the spot on the fluorescent layer with the modulated laser beam, thus forming a data carrying structure at this point in the fluorescent layer. The data carrying structure being produced by a thermal influence on the fluorescent layer and/or a photo-induced influence on the fluorescent dye molecules provided in the fluorescent layer and possibly other molecules. After irradiation, the data carrying structure obtains by means of the modulation of the laser beam, a stipulated degree of quenching of the fluorescence which is emitted from this data carrying structure when it is irradiated with fluorescence exciting radiation. The degree of quenching for the fluorescence corresponds to the value of the datum assigned by the modulated irradiation of the data carrying structure, which datum corresponds to the value of a specific level in the predetermined multilevel code.

In accordance with yet another aspect of the invention, the present invention, a method can be used for reading one of the data carrying media according to the invention and which includes directing a light beam towards a data carrying structure, by turning the light beam's wavelength to the spectral response of the fluorescent dye molecules in the data carrying structure, and by detecting the fluorescence emitted from the data carrying structure in a detector device at a distance from the data carrying medium and placed above or below. The intensity of the detected fluorescence corresponds to the value of the datum assigned to the data carrying structure, which datum represents a level in a predetermined multilevel code.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PRESENT INVENTION

Figure 1:
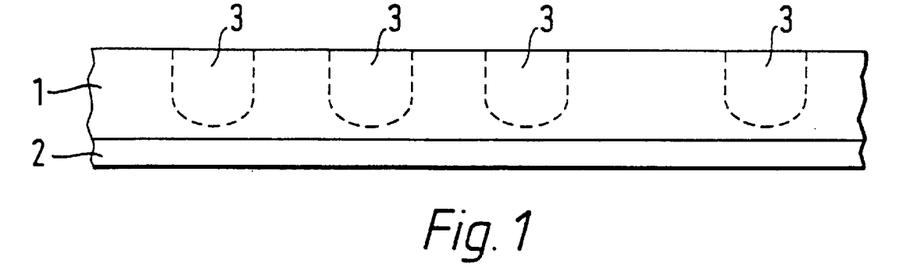
FIG. 1 is a schematic section of a data carrying medium according to the present invention.

FIG. 1 illustrates a data carrying medium having a fluorescent layer 1 arranged on a substrate 2. In the fluorescent layer 1 there are provided in its surface or from its surface and towards the substrate 2 data carrying structures generally indicated by 3. It should be understood that viewed from the top of the medium the data carrying structures 3 will be able to be arranged in a linear or curved path, for example spirally as on a CD disc, or also in rows and columns, thus forming a matrix.

Figure 2A:
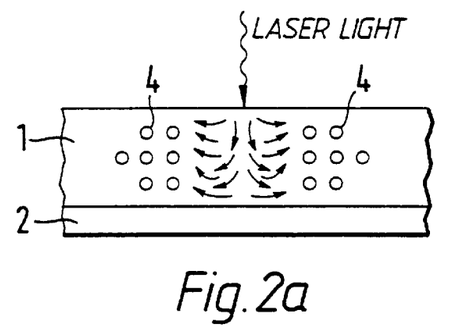
FIGS. 2a, b illustrate schematically and in section the generation of a data carrying structure in the data carrying medium.
Figure 2B:
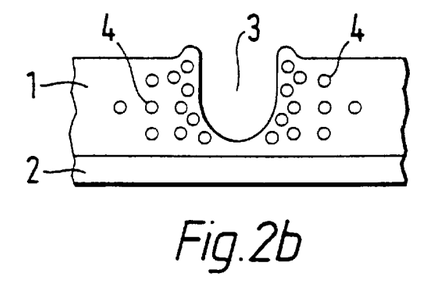
Figure 6:
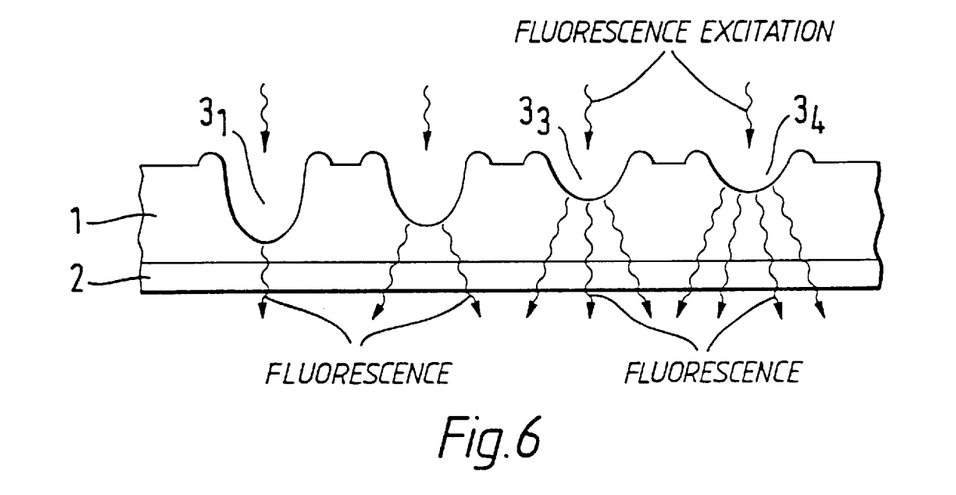
FIG. 6 illustrates schematically and in section the storage of several bits in a data carrying structure in the present invention.

The fluorescent layer 1 comprises dye molecules 4 (FIG. 2) which are advantageously embedded in a transparent polymer base material, for example of modified polymethylmethacrylate (MPMMA). The dye molecules 4 may, for example, be rhodamine molecules. Each of the data carrying structures 3 has a specific degree of quenching for the fluorescence which is emitted from a data carrying structure when it is irradiated with fluorescence exciting radiation (FIG. 6). The degree of quenching for the fluorescence refers to the fluorescence which is emitted by the virgin, fluorescent layer, i.e. a layer without data carrying structures and which is not irradiated with laser light, in order to generate data carrying structures 3. For example, the degree of quenching for the fluorescence in such a case can refer to a region of the virgin, fluorescent layer and with a surface area equal to the area of the data carrying structure 3 at the surface of the fluorescent layer 1. The degree of quenching for the fluorescence which is emitted by a data carrying structure 3 indicates the value of the datum which is stored in that data carrying structure 3.

In FIG. 1, for example, each data carrying structure 3 can represent a binary 0 or a binary 1 and the space between each data carrying structure can represent a binary 1 or a binary 0, the fluorescence which is emitted in this space naturally being the fluorescence emitted by the virgin, fluorescent layer 1.

A specific degree of quenching can be assigned to the data carrying structures in several ways. It can be achieved advantageously as illustrated in FIGS. 2a, b in which the write pulse, i.e. a beam of laser light, is incident on the fluorescent layer 1 (FIG. 2a), softening and melting the material in the fluorescent layer, thus causing a data carrying structure 3 (FIG. 2b) to be formed in the form of a pit in this layer. The processes involved can be a thermoplastic deformation, ablation or another heat-induced transport process. When the fluorescent layer 1 is irradiated with a fluorescence exciting radiation, the pit, i.e. the data carrying structure 3, will have lower fluorescence than the surrounding parts of the fluorescent layer 1, the degree of quenching for the fluorescence being substantially determined by the geometry of the heat-induced pit, in practice, e.g., depth and diameter.

Figure 3A:
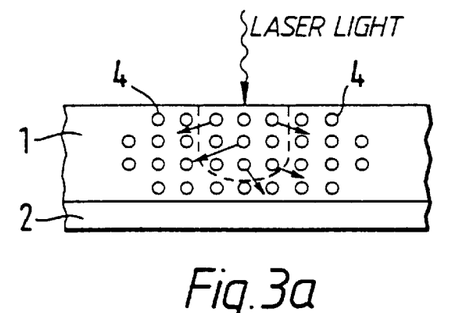
FIGS. 3a, b illustrate schematically and in section the generation of a second data carrying structure in the data carrying medium.
Figure 3B:
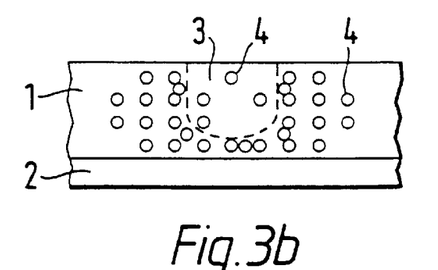

The fluorescence in the fluorescent layer 1 can also be modified on the molecular level, e.g. as in FIGS. 3a, b, by directing a beam of laser light towards the surface of the fluorescent layer 1, and by causing at least a part of the fluorescent dye molecules 4 to migrate out of the data carrying structure 3 indicated by a dotted line (FIG. 3a). Thus fewer dye molecules 4 remain in the data carrying structure 3, as illustrated in FIG. 3b, and the intensity of the fluorescent light which is emitted from the structure 3 is correspondingly impaired, thereby again achieving a specific degree of quenching for the fluorescence. The degree of quenching will substantially be determined by the ratio between the number of fluorescent dye molecules in the structure 3, respectively before and after the fluorescence has been modified by means of the laser beam.

Figure 4A:
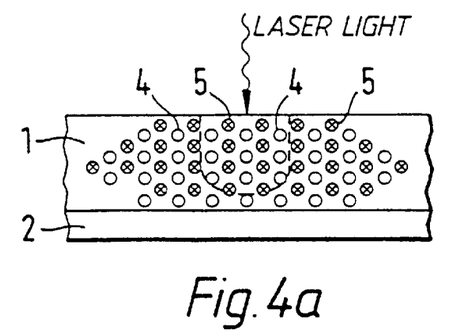
FIGS. 4a, b illustrate schematically and in section the generation of a third data carrying structure in the data carrying medium.
Figure 4B:
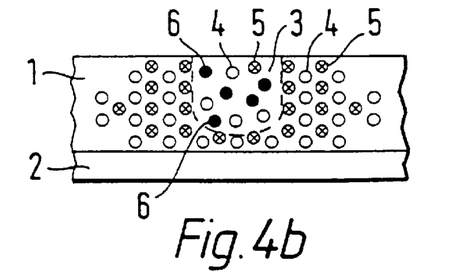

FIGS. 4a, b illustrate how a data carrying structure 3 can be formed in the fluorescent layer 1 by causing a chemical reaction between the fluorescent dye molecules 4 and reagent molecules 5 which are illustrated in the figure as circles with an x, while the dye molecules 4 are illustrated as open circles. Thus, as illustrated in FIG. 4b, a data carrying structure is obtained in which a portion of the molecules in the fluorescent layer 1 are now reaction products 6, illustrated here as filled circles, of the dye molecules 4 and reagent molecules 5, since the reaction product's molecules 6 do not fluoresce when irradiated. The data carrying structure 3 thereby created obtains a degree of quenching for the fluorescence which is determined by the number of fluorescent dye molecules 4 remaining in the data carrying structure after the fluorescence modification. The irradiation with laser light causes the dye molecules 4 to react chemically with the reagent molecules. A number of other chemical processes which can be initiated by irradiation with laser light are well known to those skilled in the art and one example which can be mentioned is that it is possible to obtain fluorescence quenching by radical formation, splitting of the dye molecules or rearrangement of the dye molecules or allowing the dye molecules to react chemically with other molecules. In this context reference can be made to D. A. Gromov & al., "Efficient Plastic-Host Dye-Lasers", J. Opt. Soc. Am., vol. 2, no. 7, pages 1028–10031 (July 1985).

According to the invention, it is possible to create data carrying structures 3 where the degree of quenching for the fluorescence corresponds to the value of the datum which is assigned to the data carrying structure, this datum corresponding to the value of a specific level in a predetermined multilevel code. Again the degree of quenching for the fluorescence refers to the fluorescence which is emitted by the virgin, fluorescent layer in a region thereof which corresponds to the area for the data carrying structure 3 in the fluorescent layer 1. It thereby also becomes possible to store several bits in one and the same data carrying structure. The use of two different degrees of quenching for the fluorescence, for example, gives a bivalent or binary code, since one degree of quenching can correspond to binary 0 and a second degree of quenching to binary 1. With four different degrees of quenching two bits can be stored. It is possible, however, to employ codes with many more levels and possible at least in theory to obtain an efficient grey scale code, e.g. by assigning a code with 1024 levels to each data carrying structure, thus making it possible to store up to ten bits. One and the same data carrying structure is thereby capable, for example, of storing the numbers 0–1023, thus increasing the data density by a factor of ten in relation to conventional optical data storage systems of the WORM type, based, for example, on reflecting/non-reflecting areas, i.e. either with 1 or 0 represented in each data carrying structure. By assigning the data carrying structures to a multilevel code, the same methods can be employed as illustrated in FIGS. 2–4, the value of the datum the data carrying structure 3 stores in FIG. 2 being given by the size of the data carrying structure or the pit, in FIG. 3 by the number of dye molecules 4 remaining in the data carrying structure, and in FIG. 4 by the number of dye molecules 4 which have not undergone a chemical reaction with the reagent molecules 5 and lost the ability to fluoresce.

In a method according to the invention for generating a data carrying structure 3 where the stored datum has a value which corresponds to a level in a predetermined multilevel code, the laser beam is modulated according to a predetermined modulation procedure which comprises a number of modulation stages corresponding to levels in the stipulated multilevel code. By forming the data carrying structure 3 with a laser beam which is given a specific modulation value, the data carrying structure obtains a corresponding degree of quenching, with the result that the fluorescence which is emitted from the data crying structure when it is irradiated with fluorescence exciting radiation, corresponds to the value of the datum assigned to the data carrying structure, which datum is produced by employing the stipulated modulation value for the laser beam which creates the data carrying structure. By generating the data carrying structures 3 the laser beam can be modulated with regard to a number of parameters. The modulation can be advantageously achieved by varying the pulse parameters, the modulation value being naturally commensurable with the value of the datum which is assigned to the data carrying structure 3 when it is generated and which again represents a specific level in the stipulated multilevel code.

Figure 5:
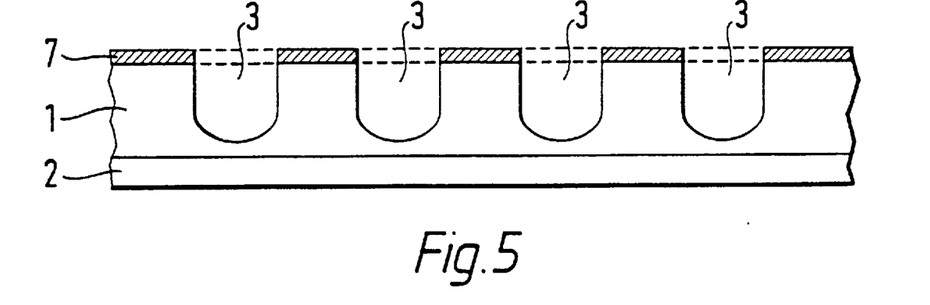
FIG. 5 is a schematic section of an embodiment of the data carrying medium according to the invention.

As illustrated in FIG. 5, there can be advantageously provided on the surface of the fluorescent layer 1 an opaque layer 7 with good radiation-absorbing properties and which disappears when irradiated with the laser light during the generation of the data carrying structures 3.

FIG. 6 illustrates schematically data carrying structures $3_1$–$3_4$ in the form of heat-induced pits of different sizes, the data carrying structures from $3_1$–$3_4$ representing in consecutive order a code with four levels and thereby each being capable of storing two bits. For example, here represents binary 11, i.e. $3_1$ and $3_4$, represents 00, i.e. 0.

Figure 7:
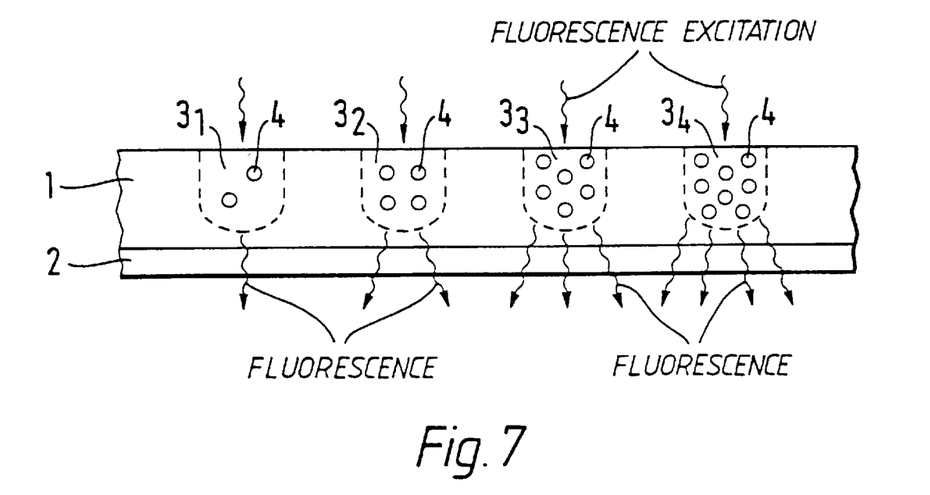
FIG. 7 illustrates schematically and in section the storage of several bits in a second data carrying structure in the present invention.

FIG. 7 illustrates the same arrangement as in FIG. 6, but the levels in each data structure 3, $3_1$–$3_4$ are determined by the number of fluorescent dye molecules 4 in the data structure created. The desired number which corresponds to a specific level in the stipulated multilevel code can be obtained either by causing a migration of the dye molecules 4 out of the data carrying structure $3_1$ or by the dye molecules 4 reacting with other molecules and forming non-fluorescent reaction products. In FIG. 7 the data carrying structure $3_1$ is illustrated schematically by two dye molecules 4 and is assigned the binary value 11, i.e. 3, while the data carrying structure $3_4$ is schematically illustrated by eight dye molecules 4 and assigned the value 0. Similarly the degree of quenching declines from the data carrying structure $3_1$ to the data carrying structure $3_4$ according to the four levels in the code employed and the data carrying structures 3 can thereby each store up to 2 bits. It should, of course, be understood that FIGS. 6 and 7 are purely schematic and only intended to illustrate the principle of data storage according to the invention, the physical realities (the number of molecules, etc.) naturally being quite different.

Figure 8:
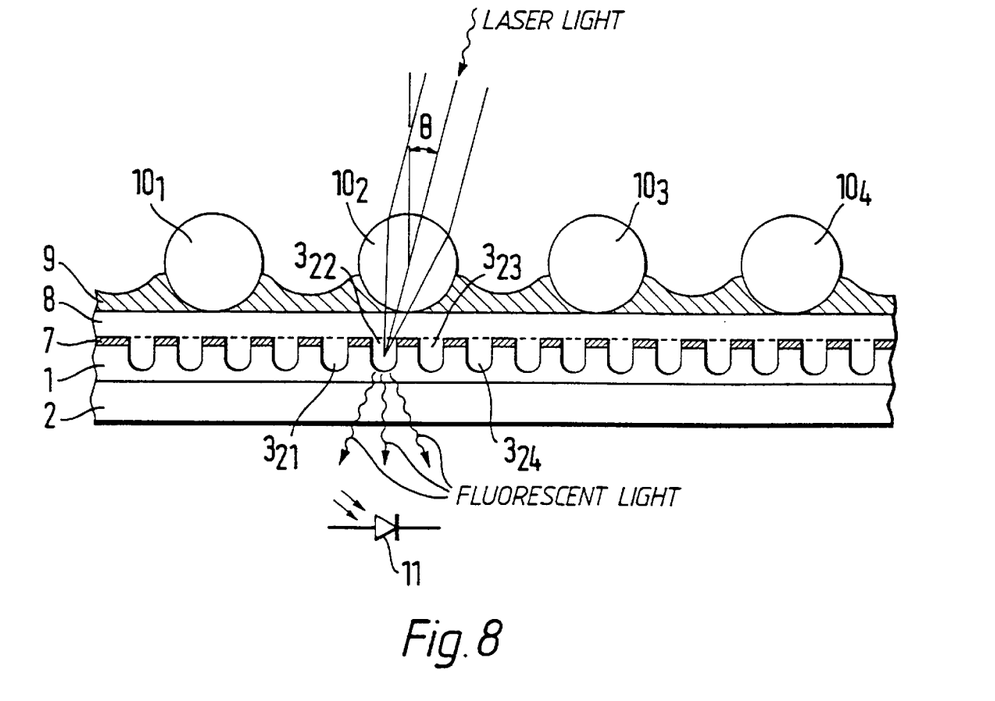
FIG. 8 illustrates schematically and in section a more realistic embodiment of a data carrying medium according to the invention.

FIG. 8 illustrates a more practical embodiment of the data carrying medium according to the invention. As already mentioned, above the fluorescent layer 1 which is treated with dye molecules 4 not shown here, there can be provided a heat-absorbing layer 7 which is opaque to both the fluorescent radiation which is emitted by the fluorescent layer and the radiation which is used to produce the fluorescence. The opaque layer 7 will, however, disappear or become transparent at the point where radiation is absorbed which is used to create the underlying data carrying structure 3. The fluorescent layer 1 is arranged above a transparent substrate 2 which has high transmissivity with regard to the fluorescent radiation emitted by the data carrying structure 3. As illustrated in FIG. 8, there are advantageously provided optically active structures $10_1$–$10_4$ on the surface of the data carrying medium. These optically active structures are illustrated in FIG. 8 as microlenses $10_1$–$10_4$ and partially embedded in a binding layer 9 which is placed over a transparent spacing layer 8. The opaque layer 7 is illustrated here arranged between the spacing layer 8 and the fluorescent layer 1, but it should be understood that if desired the layer 7 can be omitted, even though it entails certain advantages with regard to, e.g., reading of the data stored in the data carrying structures 3, since the opaque layer 7 is not influenced by the fluorescence exciting light radiation, and gives the data carrying medium increased noise immunity when reading the stored data. The microlenses $10_1$–$10_4$ can be formed from monodisperse spheres, as described in more detail in the above-mentioned NO patent application no. 900443. The microlenses $10_1$–$10_4$ are optically-geometrically arranged in unambiguous correspondence with one or more data carrying structures. In practice, however, each individual microlens 10 which typically has a diameter of a few ten $\mu$m, will be assigned to a very large number of data carrying structures, for example several thousand, since the extent of a single data carrying structure 3 compared with the dimensions of the microlens can be very small, for example well below 1 $\mu$m.

Figure 9:
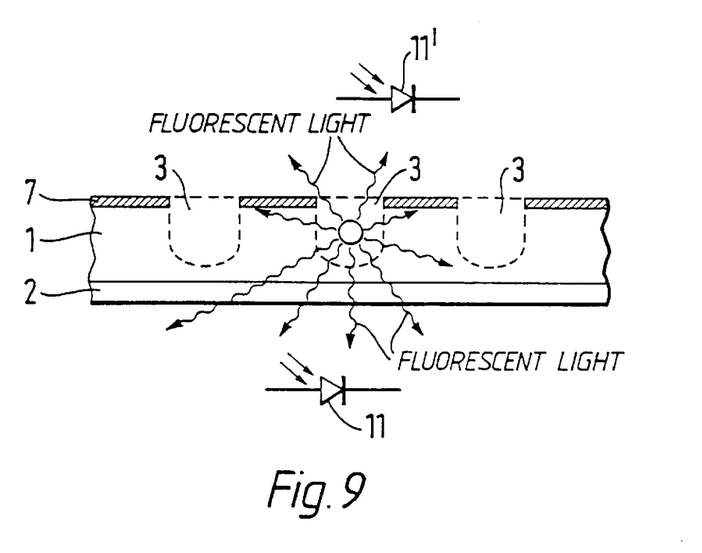
FIG. 9 illustrates schematically the principle of reading data from a data carrying medium according to the invention.

Instead of using optically active structures in the form of refractive structures such as microlenses, the optically active structures can also be diffractive structures, as described in more detail in the same applicant's simultaneously submitted International patent application no. PCT/NO96/00156. Both with the use of microlenses $10_1$–$10_4$ as illustrated in FIG. 8, and with diffractive optical structures the beam of incident light, whether it be laser light for generating the data carrying structures 3 or light radiation in order to cause fluorescence excitation in the data carrying structures 3, is unambiguously focused on a specific point in the fluorescent layer 1 in order to create a data carrying structure 3 or on a data carrying structure 3 in order thereby to cause fluorescence for reading the datum stored therein. By simultaneously employing several light beams with different angles θ of incidence and which pass through the microlens 10 or the optically active structure, it becomes possible to generate data carrying structures in parallel, since the individual light beams can naturally be modulated independently of one another by using separate sources for each individual light beam. Similarly, by simultaneously employing several light beams, but with the same angle of incidence θ in order to produce fluorescence in the data carrying structures 3, a parallel reading is obtained of a number of data carrying structures which correspond to the number of light beams employed. However, these details lie outside the scope of the present invention, but are dealt with in more detail in the above-mentioned simultaneously submitted and parallel Norwegian patent application. When reading the stored data, according to the invention a method is employed for generation and detection of a fluorescence excitation in the data carrying structures. This is also illustrated in principle in FIG. 8. A light beam with an angle of incidence θ strikes a microlens $10_2$ and is focused on one of the data carrying structures $3_{22}$. The fluorescence exciting light beam must have a wavelength which is tuned to the spectral response of the fluorescent dye molecules 4 in the data carrying structure 3. The fluorescence which is generated by excitation and emitted from the data carrying structure is detected in a detector device 11 which may be provided at a distance from the data carrying medium and placed above or below it. In FIGS. 8 and 9 it is illustrated how the fluorescence emitted emerges from the data carrying structure and passes through the transparent substrate 2, in such a manner that in this case the detector 11 would be located under the transparent substrate 2. The intensity of the detected fluorescence corresponds to the value of the datum assigned to the data carrying structure, which datum represents one of the levels in the stipulated, multilevel code. There is, however, no reason why a fluorescence detector 11' should not be provided on the top of the data carrying medium, since in this case the fluorescent light which is emitted from the data carrying structure 3 can pass through the optically active structure or microlens 10 and can thus be focused thereby on, e.g., a detector element in the optical detector 11'.

In connection with reading of the stored data, i.e. detection of the fluorescence emitted from the data carrying structure, a calibration or control can advantageously be undertaken of the read values by simultaneously reading data carrying reference structures which in consecutive order represent the value of each individual level in the stipulated multilevel code. These reference structures can advantageously be included in the number of data carrying structures which are assigned to one of the optically active structures and in this context reference should be made to FIGS. 6 and 7, where it will be seen that the data carrying structures 3 illustrated there represent reference structures for a code with four levels, the data carrying structures $3_1$–$3_4$ in consecutive order representing the individual stages in this four-level code which permits storage of up to 2 bits in each of the data structures.

In a data carrying medium according to the present invention and with the use of methods for generating a data carrying structure 3 according to the present invention it is possible to obtain very small data carrying structures, since the dye molecules 4 which are evenly distributed in the fluorescent layer 1 give a spatial definition which in the last resort is only limited by the distance between and the dimensions of the dye molecules. It is worth noting, however, that other factors can contribute to the reduction in the size of the data carrying structure or affect the fluorescent layer in a disadvantageous manner. For example the creation of clusters or crystallization of the dye molecules can give the fluorescent layer 1 a grainy structure, which can be a problem if a high concentration of dye molecules 4 is required in order to obtain sufficient fluorescence intensity in the fluorescent layer 1.

If the fluorescence quenching is achieved by a thermal process, the extent of the high temperature range which is generated during the formation of the data carrying structures will be crucial. This range can extend outside the directly illuminated volume, dependent on pulse duration and the heat transport parameters in the fluorescent layer and in the substrate. Even in cases where the fluorescence quenching is only restricted to the volume in the fluorescent layer which is subjected to an intense illumination during the formation of the data carrying structures, i.e. where no thermal diffusion extension of the volume of the data carrying structure occurs, it can be necessary to use a fluorescent layer which, in order to ensure sufficient light absorption, becomes so thick that it can lead to a loss in the definition of the site for the data carrying structure.

As mentioned above, in the formation of data carrying structures 3 according to the present invention, in order to achieve fluorescence quenching there are a number of different processes, during which the individual dye molecules 4 are influenced in situ, i.e. without material transport over a considerable distance. It is well known, for example, that a number of procedures, such as, e.g., local heating in the focal area of the write beam, can involve material transport on a molecular level. As mentioned, such processes can include radical formation, splitting, rearrangement or chemical reaction with adjacent molecules in the polymer base material. Since the present invention does not use material transport over a larger area than the contrast forming mechanism, the situation will be different from that which is the case when writing by means of thermoplastic deformation. Thus, since no substantial material flow takes place, equally there is no problem with overlapping between adjacent data carrying structures, with the result that in the present invention these can form an extremely dense pattern.

It is well documented in the literature that the fluorescence from dyes which are immobilized in a polymer base material can be quenched in varying degrees by being subjected to intense illumination, for example in a number of stages, cf. the above-mentioned article by D. A. Gromov & al. In the present invention, a multilevel coding of the data carrying structures 3 in the fluorescent layer 1 is obtained by suitable control of the intensity and the energy of the light radiation during the generation of the data carrying structures and the writing of data. During the reading of data the remaining fluorescence from the data carrying structures can be quantified by employing a well defined light pulse in order to generate fluorescence from the data carrying structure during the reading, thereby indicating a multibit condition in the data carrying structure.

According to the present invention the fluorescence quenching is provided by, e.g., modulating the intensity and the pulse energy of the incident light. The ratios between the chosen modulation parameters for the write beam can be linear, non-linear or threshold-dependent. As an example of the latter, it can be mentioned that where the fluorescence quenching is effected by local heating by absorption of the light, the fluorescence quenching will not become effective until a threshold temperature is reached, e.g. the glass transition temperature for the polymer base material in the fluorescent layer 1. In a practical implementation of multilevel coding of the data carrying structures 3 according to the invention, it should therefore be understood that the choice of parameters for generating such data carrying structures is largely dependent on empirical specific data.

The number of achievable levels when using multilevel coding of the data carrying structures 3 is dependent on the equipment which is used for the generation and implies that consideration must be given to both the write and read speeds as well as the data storage density in the data storage medium in addition to the stipulated costs for equipment and data storage media.

As an example of what it is possible to achieve with regard to the number of levels in the multilevel code used, reference is made to experiments with fluorescence quenching of xanthene dyes embedded in polymethylmethacrylate, by means of successive light pulses. The exposure levels varied from a very high level where all fluorescence was quenched in a single pulse, and downwards. It was observed that the number of pulses which was necessary for a specific degree of fluorescence quenching was reproducibly associated with the exposure level. In this context reference may be made to the above-mentioned article by D. A. Gromov & al. Based on these results the maximum achievable number of stages for multilevel coding lies in the range from 100–2000, i.e. it is possible to store approximately 5–10 bits in each data carrying structure 3 according to the present invention. As a comparison, reference may be made to the previously mentioned optical data storage based on electron capture (ETOM) which is particularly relevant in this connection, since it too is based on fluorescence. Even though the materials and storage principles employed are completely different from those in the present invention, the basic limitations with respect to equipment and fluorescence detection are similar. Reading from ETOM is performed on thirteen levels and, as mentioned above, it is claimed that sixteen levels, i.e. 4 bit storage, will be implemented in commercial versions.

When reading data from the data carrying structures 3 in the data storage medium according to the present invention, the fluorescent layer is illuminated at different sites for the data carrying structures by a relatively weak light beam, which produces the fluorescence of the data carrying structures. Even though the incident, fluorescence exciting light strikes the data carrying structure or the fluorescent layer from different directions, in every case the fluorescent light which is emitted by the data carrying structure will be emitted isotropically (FIG. 9). Even though only a relatively small portion of the total fluorescence emission from a data carrying structure is directed in such a manner that it is intercepted by the detection system, in a first approximation this portion will be the same for all positions of the data carrying structures and exposure directions. This also includes reflection or transmission from the back of the data storage medium, where fluorescent light emitted from all data carrying structures will have the same distribution with regard to angle intensity. Elimination of problems associated with variable or total reflection represent an important aspect of the use of fluorescence-based data carrying structures.

Since the generation of data carrying structures 3 and detection of their emitted fluorescence takes place in two different wavelength ranges, it becomes possible to remove direct light radiation which leaks between the fluorescent layer 1, as well as false reflections of this light inside the data storage medium. This is achieved by using a filter which is placed on the detector 11 for fluorescence emission and/or by treating the substrate 2 for the data storage medium with a spectrally adapted, non-fluorescent dye. Crosstalk in the detection wavelength can be reduced by introducing absorption in the substrate, thus obtaining a substantial impairment of the fluorescent light which is propagated over distances which are much greater than the thickness of the substrate. Furthermore, the use of an opaque layer, 7 over the fluorescent layer can help to increase the noise immunity of the data storage medium according to the invention, either by absorbing reflections on the interfaces of the fluorescent layer or by masking reflected or scattered fluorescent light from adjacent data carrying structures 3 when the detection of the fluorescent light is implemented by focusing through optically active structures 10.

In order to produce a thin fluorescent layer 2 as used in the data storage medium according to the present invention, a number of different dyes can be employed, e.g. coumarin, xanthene or oxazine dyes and firm base materials, e.g. thermohardened polymers or thermoplastic polymers. After the dye has been dissolved in the base material and before the latter is hardened, a number of possible coating processes for thin film can be applied to the layer, such as spin-coating, electrostatic spray coating, knife spreading or meniscus coating. In order to achieve a good definition of the data carrying structures 3, the layer thickness should be less than 1 $\mu$m and the dye's density and layer thickness must be controlled very accurately in those cases where multilevel coding of the data carrying structures is to be employed. This lies well within the possibilities offered by present day technology for mass production processes, even where a curved spacing layer is used concentrically with the spherical microlenses and a corresponding curved fluorescent layer.

As a concrete example of this, reference is made to the dye/polymer system described in the above-mentioned article by D. A. Gromov & al., where rhodamine 6 g was embedded in a base material of modified polymethylmethacrylate (MPMMA). When the chloride of rhodamine 6 g was illuminated with 50 ns pulses of laser light with a wavelength of 530 nm, the fluorescence was completely quenched with 180 pulses of an intensity of 1 J/cm$^2$ (corresponding to 10 nJ/$\mu$m$^2$. Increasing the intensity to 1.6 J/cm$^2$, corresponding to 16 nJ/$\mu$m$^2$ caused complete fluorescence quenching in a single pulse. This corresponds to a laser output of 10 mW, focused at 0.25 $\mu$m$^2$ and with a pulse length of 400 ns. These parameters are close to those which are used at present in conventional optical data storage.

Finally it should be mentioned that if the data medium according to the invention is designed in the form of a hybrid layer as illustrated in FIG. 8, dye/polymer systems can also be used where fluorescence quenching is not possible. By means of the basically opaque layer 7 which is arranged above the fluorescent layer 4, e.g. in the form of a hole-forming metal layer, light is prevented from reaching the fluorescent layer, apart from areas where the opaque layer is influenced during the writing process. During reading fluorescence will only be able to be excited from those openings which are formed in the opaque layer. This method, which is based on the use of a controlled fluorescence excitation, permits the use of writable layers which are not fluorescent in the wavelength range where the detection takes place, but which can nevertheless be irradiated in order to form an opaque or completely transmitting state, corresponding to binary 0 or binary 1 respectively. The layer is also irradiated in such a manner that the degree of transmission (the absorption) varies in several stages, thus making it possible to store more than one bit in each data carrying structure in the fluorescent layer. Four stages or transmissivity levels will, e.g., permit the storage of 2 bits. This implies a considerable expansion of the possibilities for choosing material for a practical implementation of the data carrying medium.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A data-carrying medium comprising
a fluorescent layer arranged on a substrate and having a surface, the fluorescent layer composed of fluorescent dye molecules embedded in a transparent polymer base material;
a plurality of data-carrying structures formed by the fluorescent layer, wherein each of the data-carrying structures has optical states represented by a specific degree of quenching of fluorescence emitted from the data-carrying structure when irradiated with a fluorescence exciting radiation, the specific degree of quenching primarily determined by the fluorescent dye molecules.

2. A data-carrying medium according to claim 1, wherein each data-carrying structure is associated with two binary digits, the degree of quenching representing a first binary digit as a binary 0 or a binary 1, and the space between each data-carrying structure representing a second binary digit as a binary 1 or a binary 0 by means of the fluorescence emitted by a virgin fluorescent layer.

3. A data-carrying medium according to claim 1, wherein the data-carrying structure is a thermally induced pit in the fluorescent layer, the data-carrying structure thus having a degree of quenching for the fluorescence substantially determined by the geometry of the thermally induced pit.

4. A data-carrying medium according to claim 1, wherein the data-carrying structure is a fluorescence-modified region in the fluorescent layer, the fluorescence modified region being formed by causing a migration of at least some of the fluorescent dye molecules out of the data-carrying structure, with the result that the degree of fluorescence modification corresponds to a ratio between a number of fluorescent dye molecules in the region of the data-carrying structure before and after the fluorescence modification respectively, whereby the data-carrying structure obtains a degree of quenching for the fluorescence substantially determined by the number of dye molecules remaining in the data-carrying structure after the fluorescence modification.

5. A data-carrying medium according to claim 1, wherein the data-carrying structure is a fluorescence-modified region in the fluorescent layer, the fluorescence modified region being formed by causing a chemical change in at least some of the fluorescent dye molecules, with the result that fluorescent dye molecules having undergone the chemical change no longer fluoresce and the degree of fluorescence modification corresponds to a ratio between a number of fluorescent dye molecules in the region of the data-carrying structure before and after the fluorescence modification respectively, whereby the data-carrying structure obtains a degree of quenching for the fluorescence substantially determined by the number of dye molecules remaining in the data-carrying structure after the fluorescence modification.

6. A data-carrying medium according to claim 5, wherein the chemically changed, non-fluorescent dye molecules are a reaction product between the fluorescent dye molecules and additional molecules present in the base material, said additional molecules reacting chemically with the dye molecules under a controlled, external physical influence on the fluorescent layer.

7. A method for generating a data-carrying structure having a specific degree of quenching in a data-carrying medium comprising a fluorescent layer, the method comprising:
directing a laser beam towards a point on the fluorescent layer;
irradiating said point in such a manner that a data-carrying structure is formed at said point in the fluorescent layer; and
producing the data-carrying structure by at least one of a thermal influence on the fluorescent layer and a photo induced influence on the fluorescent dye molecules provided in the fluorescent layer, wherein the data-carrying structure has optical states represented by the specific degree of quenching for the fluorescence which is emitted from the data-carrying structure when irradiated with fluorescence exciting radiation, the degree of quenching for the fluorescence referring to the fluorescence emitted by a virgin layer in a region whose surface area is equal to the area of the data-carrying structure at the surface of the fluorescent layer, the specific degree of quenching primarily determined by the fluorescent dye molecules.

8. A data-carrying medium comprising:
a fluorescent layer arranged on a substrate and having a surface, the fluorescent layer composed of fluorescent dye molecules embedded in a transparent polymeric base material;
a plurality of data-carrying structures in the fluorescent layer in the surface or beneath the surface the data-carrying structures forming a matrix, wherein each of the data-carrying structures has greater than two optical states represented by a specific degree of quenching for fluorescence emitted from the data-carrying structure when irradiated with a fluorescence exciting radiation, each of the optical states corresponding to a specific code level in a predetermined, multilevel code.

9. A data-carrying medium according to claim 8, wherein the multilevel code is a bivalent or binary code.

10. A data-carrying medium according to claim 8, wherein the multilevel code is a grey scale code.

11. A data-carrying medium according to claim 8, wherein the data-carrying structure is a thermally induced pit in the fluorescent layer, the data-carrying structure thus having a degree of quenching for the fluorescence substantially determined by the geometry of the thermally induced pit.

12. A data-carrying medium according to claim 8, wherein the data-carrying structure is a fluorescence-modified region in the fluorescent layer, the fluorescence modified region being formed by causing a migration of at least some of the fluorescent dye molecules out of a the data-carrying structure, with the result that the degree of fluorescence modification corresponds to a ratio between a number of fluorescent dye molecules in the area of the data-carrying structure before and after the fluorescence modification respectively, whereby the data-carrying structure obtains a degree of quenching for the fluorescence substantially determined by the number of dye molecules remaining in the data-carrying structure after the fluorescence modification.

13. A data-carrying medium according to claim 8, wherein the data-carrying structure is a fluorescence-modified layer in the fluorescent layer, the fluorescence modified layer being formed by causing a chemical change of at least some of the fluorescent dye molecules, with the result that fluorescent dye molecules having undergone the chemical change no longer fluoresce and the degree of fluorescence modification corresponds to a ratio between the number of fluorescent dye molecules in the region of the data-carrying structure before and after the fluorescence modification respectively, whereby the data-carrying structure obtains a degree of quenching of the fluorescence substantially determined by the number of dye molecules remaining in the data-carrying structure after the fluorescence modification.

14. A data-carrying medium according to claim 13, wherein the chemically changed, non-fluorescent dye molecules are a reaction product between the fluorescent dye molecules and additional molecules present in the base material, said additional molecules reacting chemically with the dye molecules under a controlled, external physical influence on the fluorescent layer.

15. A data-carrying medium according to claim 8, wherein the polymer base material is selected from thermohardened polymers or thermoplastic polymers such as polymethylmethacrylate.

16. A data-carrying medium according to claim 8, wherein the fluorescent dye molecules are selected from dye molecules belonging to the coumarin class, the xanthene class or the oxazine class.

17. A data-carrying medium according to claim 8, further comprising a radiation-absorbing layer which is opaque to both the fluorescent radiation emitted by the fluorescent layer and the fluorescence exciting radiation, said radiation absorbing layer being provided on a surface of the fluorescent layer.

18. A data-carrying medium according to claim 8, wherein the substrate has high transmissivity at the fluorescent radiation emitted by a data-carrying structure.

19. A data-carrying medium according to claim 8, wherein a sequence, row or column of data-carrying structures comprises one or more reference structures which in consecutive order represent the value of each individual level in the predetermined multilevel code.

20. A data-carrying medium according to claim 17, further comprising optically active structures provided in at least one of the surface of the fluorescent layer and the opaque radiation-absorbing layer.

21. A data-carrying medium according to claim 20, wherein the optically active structures are refractive structures and optically-geometrically arranged in unambiguous correspondence with one or more data-carrying structures.

22. A data-carrying medium according to claim 21, wherein the optically active structures are microlenses, partially embedded in a bonding layer formed over at least one of the fluorescent layer and the opaque radiation-absorbing layer provided on the fluorescent layer.

23. A data-carrying medium according to claim 8, wherein the optically active structures are diffractive structures and optically-geometrically arranged in unambiguous correspondence with at least one data-carrying structures.

24. A method for generating a data-carrying structure having a stipulated degree of quenching in a data-carrying medium comprising a fluorescent layer comprising fluorescent dye molecules, the method comprising:

directing a laser beam towards a point on the fluorescent layer;

modulating the laser beam according to a predetermined modulation procedure having a number of modulation stages corresponding to levels in a predetermined multilevel code;

irradiating the point on the fluorescent layer with the modulated laser beam, thus forming a data-carrying structure at the point in the fluorescent layer; and producing the data-carrying structure having multiple optical states recorded in accordance with the modulating of the laser beam, each of the multiple optical states associated with a stipulated degree of quenching of the fluorescence emitted from the data-carrying structure when irradiated with fluorescence exciting radiation.

25. A method according to claim 24, wherein the modulating is performed with regard to at least one of the following parameters: pulse duration, pulse length, pulse amplitude and pulse frequency in a shower of radiation, the modulation value being chosen commensurably with the value of the datum which is thereto assigned by the generation of the data-carrying structure and which represents the specific level in the predetermined multilevel code.

26. A method for generating and detecting a fluorescence excitation in a data-carrying structure in a data-carrying medium comprising a fluorescent layer, the method comprising:

directing a light beam towards a data-carrying structure;

tuning a wavelength of the light beam to the spectral response of the fluorescent dye molecules in the data-carrying structure; and detecting the fluorescence emitted from the data-carrying structure having multiple states associated with corresponding degrees of quenching, the detecting accomplished by a detector device at a distance from the data-carrying medium and placed over or under it, the intensity of the detected fluorescence corresponding to the value of the datum assigned to the data-carrying structure, which datum represents a level in a predetermined multilevel code.

27. A method according to claim 26, further comprising referring to the detected fluorescence emitted by a data-carrying structure to the fluorescence which is emitted by excitation of one or more reference structures which in consecutive order represent the value of each individual level in the predetermined multilevel code.

28. A data-carrying medium according to claim 1, wherein at least one of said data-carrying structures has a degree of quenching which is less than complete quenching, the degree of quenching defined with reference to a maximum intensity of fluorescence emitted by a virgin fluorescent layer with a reference surface area substantially equal to a radiating surface area of the data-carrying structure at the surface.

29. A data-carrying medium according to claim 8, wherein at least one of said data-carrying structures has a degree of quenching which is less than complete quenching, the degree of quenching defined with reference to a maximum intensity of fluorescence emitted by a virgin fluorescent layer with a reference surface area substantially equal to a radiating surface area of the data-carrying structure at the surface.

30. The data-carrying medium according to claim 1, wherein the data-carrying structures generally form a matrix including at least one row and at least one column.

31. The data-carrying medium according to claim 1, wherein the data-carrying structures generally follow a curved path in a spiral and wherein the data-carrying medium is shaped like a disc.

32. A method for generating data-carrying structures in a data-carrying medium, wherein the data-carrying medium comprises a fluorescent layer arranged on a substrate and including fluorescent dye molecules embedded in a transparent polymer base material, wherein the data-carrying structures are provided in the fluorescent layer in its surface or beneath its surface, the data-carrying structures forming a matrix, the method for generating said data-carrying structures comprising the steps of:

applying a controlled amount of radiative energy to the data-carrying medium at the intended position of a data-carrying structure for the generation thereof with a specific degree of quenching;

controlling the amount of radiative energy by a modulation thereof according to a predetermined modulation procedure, said modulation procedure comprising one or more modulation stages, with the number of modulation stages employed corresponding to the number of specific degrees of quenching, such that the specific degree of quenching is obtained in the data-carrying structure by a radiation-induced reduction in the amount of fluorescent material in the data-carrying medium at the position of the data-carrying structure, the number of dye molecules in each data-carrying structure varying with the specific degree of quenching of the respective data-carrying structure;

assigning a data value corresponding to the intensity of fluorescence emitted from this data-carrying structure when the data-carrying structure is irradiated with a fluorescence-exciting radiation, said specific degree of quenching for the fluorescent referring to the unquenched fluorescence emitted by the virgin fluorescent layer in a region whose surface area equals the area of the data-carrying structure at the surface of the fluorescent layer.

33. The method according to claim 32, wherein the radiative energy to generate a data-carrying structure is supplied by a laser beam which is modulated according to the modulation procedure.

34. The method according to claim 32, wherein each data-carrying structure is generated with a specific degree of quenching representing a value in a predetermined multilevel code.

35. The method according to claim 32, wherein the data-carrying structure is formed as a thermally induced pit in the fluorescent layer, whereby the data-carrying structure obtains specific degree of quenching of the fluorescent substantially determined by the geometry of the thermally induced pit.

36. The method according to claim 32, wherein the data-carrying structure is formed as a fluorescent-modified region in the fluorescent layer, the fluorescence modification being provided by causing a migration of at least a part of the basically fluorescent dye molecules out of the data-carrying structure, such that the resulting degree of the fluorescence modification corresponds to the ratio between the number of fluorescent dye molecules in the region for the data-carrying structure before and after the fluorescence modification respectively, whereby the data-carrying structure obtains a specific degree of quenching of the fluorescence substantially determined by the concentration of dye molecules remaining in the data-carrying structure after the fluorescence modification.

37. The method according to claim 32, wherein the data-carrying structure is formed as a fluorescence-modified region in the fluorescent layer, the fluorescence modification being provided by causing a chemical change in at least a part of the basically fluorescent dye molecules, with the result that they no longer fluoresce, such that the resulting degree of fluorescence modification corresponds to the ratio between the number of fluorescent dye molecules in the region for the data-carrying structure before and after the fluorescence modification respectively, whereby the data-carrying structure obtains a specific degree of quenching of the fluorescence substantially determined by the number of dye molecules remaining in the data-carrying structure after the fluorescence modification.

38. The method according to claim 37, characterized by the chemically changed, non-fluorescent dye molecules being generated as a reaction product of the basically fluorescent dye molecules and additional molecules present in the base material, said additional molecules reacting chemically with the dye molecules under the influence of radiative energy as applied to the data-carrying medium.

* * * * *